United States Patent [19]
Eitan

[11] Patent Number: 5,963,465
[45] Date of Patent: Oct. 5, 1999

[54] SYMMETRIC SEGMENTED MEMORY ARRAY ARCHITECTURE

[75] Inventor: Boaz Eitan, Ra'anana, Israel

[73] Assignee: Saifun Semiconductors, Ltd., Ra'anana, Israel

[21] Appl. No.: 08/989,690

[22] Filed: Dec. 12, 1997

[51] Int. Cl.⁶ .................................................. G11C 5/06
[52] U.S. Cl. .............................................. 365/63; 365/51
[58] Field of Search .................... 365/63, 51, 185.11, 365/185.16, 185.33

[56] References Cited

U.S. PATENT DOCUMENTS

| | | | |
|---|---|---|---|
| 4,281,397 | 7/1981 | Neal et al. | 365/189 |
| 5,204,835 | 4/1993 | Eitan | 365/185 |
| 5,315,541 | 5/1994 | Harari et al. | 365/63 |
| 5,495,440 | 2/1996 | Asakura | 365/149 |
| 5,583,808 | 12/1996 | Brahmbhatt | 365/185.05 |
| 5,623,438 | 4/1997 | Guritz et al. | 438/598 |
| 5,777,919 | 7/1998 | Chi-Yung et al. | 365/104 |

*Primary Examiner*—David Nelms
*Assistant Examiner*—Hien Nguyen
*Attorney, Agent, or Firm*—Skjerven, Morrill MacPherson, Franklin & Friel; Alan H. MacPherson

[57] ABSTRACT

A symmetric memory array includes a multiplicity of repeating segments formed into rows and columns. Each segment includes a cell area formed of four segmented cell bit lines an even select area and an odd select area. The even select area is located at one end of the cell area and includes a segmented even contact bit line and two select transistors connecting the even contact bit line with the even cell bit lines of the segment. The odd select area is located at the opposite end of the cell area and includes a segmented odd contact bit line and two select transistors connecting the odd contact bit line with the odd cell bit lines of the segment. The array additionally includes one even contact connected to the even contact bit lines of two neighboring even select areas, one odd contact connected to the odd contact bit lines of two neighboring odd select areas and alternating even and odd metal lines connecting to the even and odd contacts, respectively.

15 Claims, 9 Drawing Sheets

SYMMETRIC SEGMENTED MEMORY ARRAY ARCHITECTURE

FIELD OF INVENTION

The present invention relates to memory array architectures generally and to symmetric memory array architectures in particular.

BACKGROUND OF THE INVENTION

Memory arrays are well known in the art and comprise matrices of memory cells organized into rows and columns. Each memory cell comprises a source, a drain and a gate, each of which has to receive voltage in order for the cell to be accessed. Columns of sources and columns of drains are connected together by bit lines while rows of gates are connected together by word lines. To activate a cell, one drain bit line, one source bit line and one word line must receive voltage.

A standard memory array architecture consists of one metal line on each column, periodically connected to the underlying bit line via a contact. The contact typically is large and is present within the memory array area. The word line is typically of lower resistance and its contact is located outside of the memory array area. There is typically a common source line for a plurality of memory cells. Furthermore, the metal lines are themselves quite thick. Typically, the distance between bit lines is defined by the width of either or both of the metal lines and the contacts, where the contacts are typically wider than the metal lines.

Various memory array architectures are known which reduce the size of the memory array area by reducing the number of contacts and/or metal lines. In virtual ground architectures, the common ground line is eliminated. Instead, the drain of one cell serves as the source for its neighboring cell. Bit lines are continuous diffusions with a contact to the metal lines every X (8, 16, 24, 32, 64, 128, etc.) cells to reduce resistance. The gain in area is up to 40% due to the reduced number of contacts and the elimination of the common source line.

To further reduce array size, the alternate metal, virtual ground architecture (AMG), described in U.S. Pat. No. 5,204,835, has two bit lines per metal line. Typically, in the AMG architecture, the cell size is close or equal to the minimum feature size possible for the cells.

Standard virtual ground architectures access every cell symmetrically (i.e. every bit line receives voltage directly from a metal line). The AMG architecture, which is more compact than standard virtual ground architectures, directly provides voltage to the metalized bit lines but indirectly provides voltage to the segmented, non-metalized bit lines. As a result, the voltage on an activated non-metalized bit line (which is provided through n-channel select transistors) is lower than the voltage on a simultaneously activated metalized bit line. Furthermore, n-channel transistors are not good at passing the high voltages needed for programming.

The non-symmetry of the AMG architecture makes it difficult to use with a nitride read only memory (NROM) array which stores two bits in each NROM cell. Such a cell is described in applicant's copending application Ser. No. 08/905,286, filed Aug. 1, 1997 entitled "Two Bit Non-Volatile Electrically Erasable and Programmable Semiconductor Memory Cell Utilizing Asymmetrical Charge Trapping" and assigned to Saifun Semiconductors, the same assignee as for this application, whose disclosure is incorporated herein by reference. The two bits in a cell are located on each side of the cell and each bit is accessed by voltages on the two neighboring bit lines of the cell. Accordingly, the cell requires that its two neighboring bit lines receive equivalent amounts of voltage thereby to read both bits equally (although not simultaneously).

Some architectures segment the bit lines. Each row of segmented bit lines is called a "block" and each block typically includes block select transistors to activate only one block at a time. This is particularly important for FLASH electrically erasable, programmable, read only memory (FLASH EEPROM) arrays which pass high voltages along the bit lines during programming and erase operations. During programming, the bit line voltages disturb the unselected cells. To reduce the total time the programming voltage disturbs the cells, the bit lines are segmented into small blocks.

SUMMARY OF THE PRESENT INVENTION

An object of the present invention is to provide a compact, symmetric architecture.

There is therefore provided, in accordance with a preferred embodiment of the present invention, a symmetric memory array which includes a multiplicity of repeating segments formed into rows and columns. Each segment includes a cell area formed of four segmented cell bit lines, an even select area and an odd select area. The even select area is located at one end of the cell area and includes a segmented even contact bit line and two select transistors connecting the even contact bit line with the even cell bit lines of the segment. The odd select area is located at the opposite end of the cell area and includes a segmented odd contact bit line and two select transistors connecting the odd contact bit line with the odd cell bit lines of the segment. The array additionally includes one even contact connected to the even contact bit lines of two neighboring even select areas, one odd contact connected to the odd contact bit lines of two neighboring odd select areas and alternating even and odd metal lines connecting to the even and odd contacts, respectively.

The architecture of the present invention provides two diffusion bit lines for each metal line, which saves space in the array. The array is symmetric and provides a constant resistance for every cell in the array. The latter is achieved by having segmented cell bit lines which receive power through only one select transistor and by having alternating cell bit lines receiving power from alternating select areas. Thus, each cell has one bit line connected to its upper select area and one bit line connected to its lower select area. As a result, the distance current travels from one contact through the active cell to the other contact is the same for every cell in the array.

Moreover, in accordance with a preferred embodiment of the present invention, the memory cells can be any one of the following types of memory cells: read only memory (ROM), programmable read only memory (PROM), erasable programmable read only memory (EPROM), electrically erasable programmable read only memory (EEPROM), FLASH erasable electrically programmable read only memory (FLASH EEPROM), nitride ROM (NROM), dual bit ROM and dual bit NROM.

There is also provided, in accordance with an alternative embodiment of the present invention, a symmetric memory array including a multiplicity of memory cells, a plurality of even and odd segmented cell bit lines, and generally half as many metal lines as bit lines. Each of the memory cells is formed between neighboring even and odd cell bit lines.

Each metal line provides power to either two consecutive even cell bit lines or two consecutive odd cell bit lines.

Finally, there is provided, in accordance with a preferred embodiment of the present invention, a symmetric memory array including a multiplicity of memory cells, at least one contact region and two select cells. Each memory cell comprises a virtual source region, a virtual drain region and a channel region formed therebetween. The contact region is isolated from the memory cells. One select cell is formed between each contact region and the virtual source region of each of the memory cells and the second select cell is formed between the contact region and the virtual drain region of each of the memory cells. Each memory cell receives power to its virtual regions from contact regions located above and below the memory cell.

BRIEF DESCRIPTION OF THE DRAWINGS

The present intention will be understood and appreciated more fully from the following detailed description taken in conjunction with the drawings in which.

DETAILED DESCRIPTION OF PREFERRED EMBODIMENTS

Figure 1:
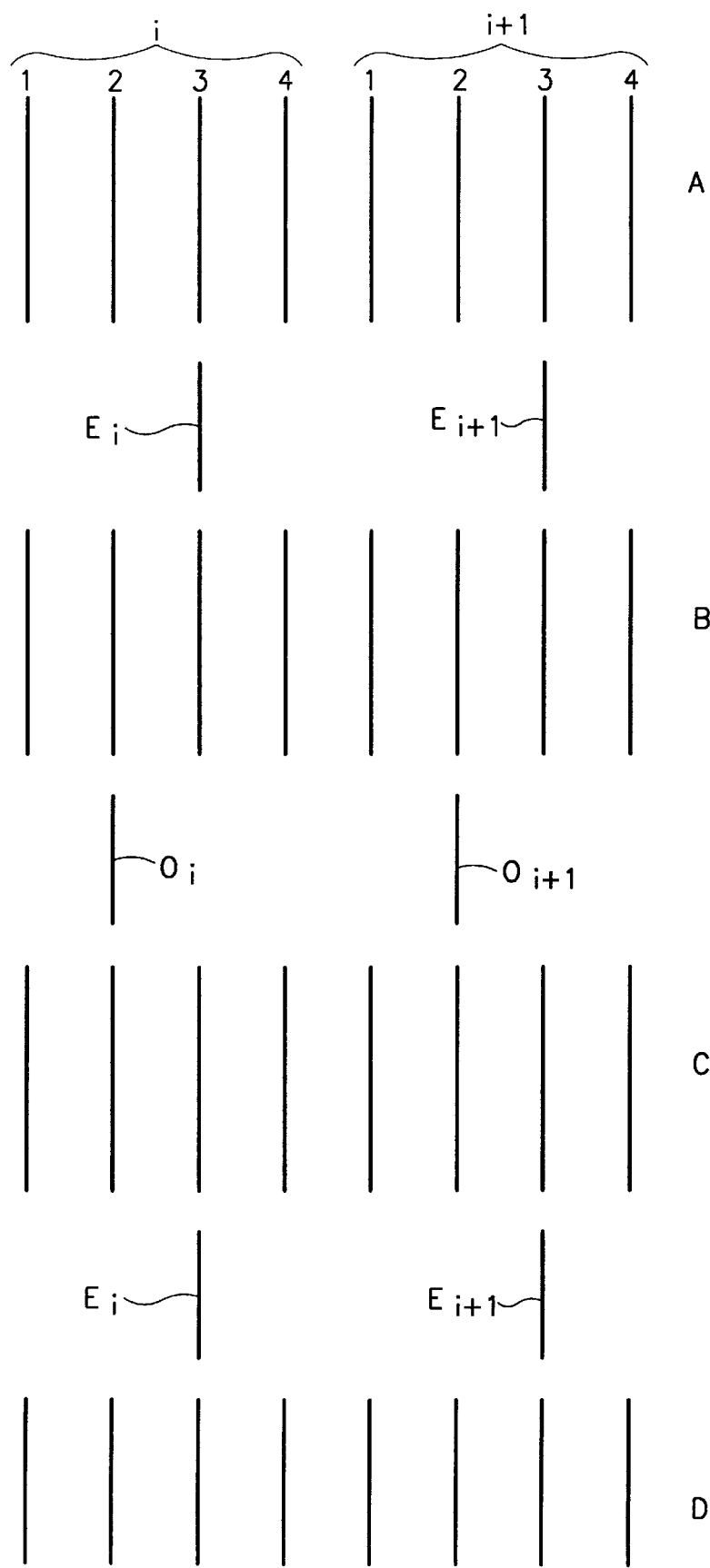
FIG. 1 a schematic illustration of an arrangement of bit lines in a memory array, in accordance with a preferred embodiment of the present invention.

Reference is now made to FIG. 1 which schematically illustrates the arrangement of bit lines within the memory array of the present invention.

The memory array is divided into alternating cell areas and select areas, where the cell areas have cell bit lines and the select areas have contact bit lines. Four cell areas are shown, labeled A, B, C and D. A typical memory area will have many more cell areas than shown.

The cell bit lines are organized into groups, each group having four columns. Two groups i and i+1 are shown, each group having columns labeled 1, 2, 3, 4. The contact bit lines come in two flavors, even and odd (labeled E and O, respectively) and are found in alternate select areas. Every group of cell bit lines is associated with one even and one odd contact bit line. Thus, FIG. 1 shows even select areas between cell areas A and B and between cell areas C and D. Both even select areas have two even contact bit lines $E_i$ and $E_{i+1}$. FIG. 1 shows an odd select area between cell areas B and C which has two odd contact bit lines $O_i$ and $O_{i+1}$.

As can be seen, there is one contact bit line per group of four cell bit lines per select area and there are two types of select areas. FIG. 1 shows that the even contact bit lines E are associated with column 3 of each group while the odd contact bit lines are associated with column 2 of each group. As will be shown in the layouts of FIGS. 4 and 5, the contact bit lines are not necessarily formed within column 2 or 3 but rather within a four column portion of the select area.

Figure 2:
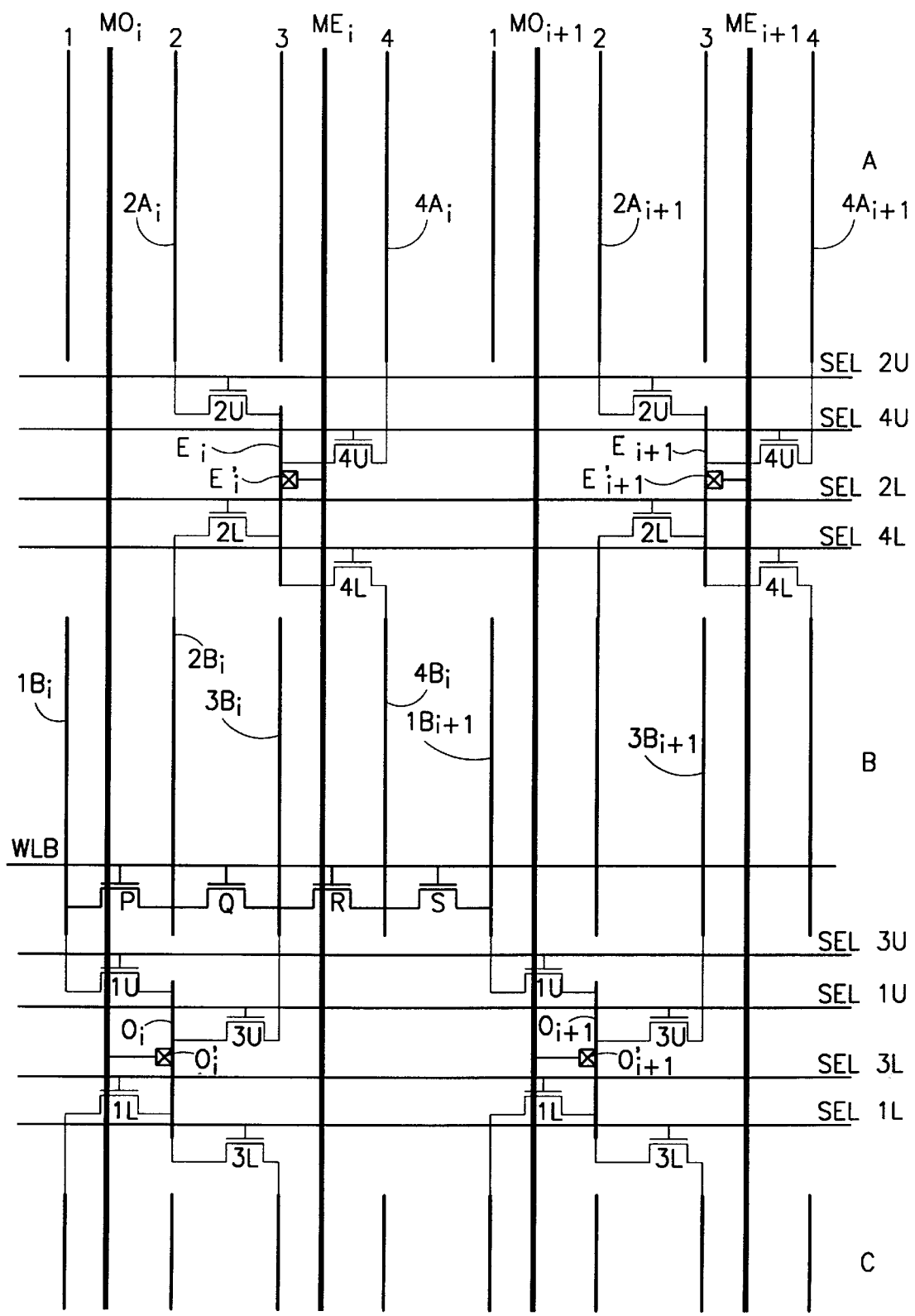
FIG. 2 is a schematic illustration of an exemplary arrangement of metal lines over the bit lines of FIG. 1 in accordance with the present invention.

As shown in FIG. 2 to which reference is now made, one contact is formed on each contact bit line and is labeled with an apostrophe ('). For example, the contacts of contact bit lines $E_i$ are labeled $E_i$'. Since there is only one contact bit line per four cell bit lines, the contact can be as large as necessary without generally affecting the distance between cell bit lines.

There are two metal lines MO and ME per group of cell bit lines, where even metal lines ME connect together the even contacts of the group and odd metal lines MO connect together the odd contacts of the group.

There are four select transistors connected to each contact bit line O or E and each type of select transistor is controlled by its own select line SEL. Each select transistor connects its contact bit line to one nearby cell bit line. Thus two of the four select transistors connect to two of the cell bit lines in the group of cell bit lines above the contact bit line. Similarly, the remaining two of the four select transistors connect to two of the four cell bit lines in the group below.

In accordance with a preferred embodiment of the present invention, the select transistors associated with each odd contact bit line O connect only to odd columns and the select transistors associated with each even contact bit line E connect only to even columns. Thus, the four select transistors 2U, 4U, 2L, 4L of each contact bit line E connect to columns 2 and 4 of the upper group of bit lines and to columns 2 and 4 of the lower group of bit lines, respectively. These four select transistors are activated by select lines SEL 2U, SEL 4U, SEL 2L and SEL 4L, respectively. Similarly, the four select transistors 1U, 3U, 1L, 3L of contact bit line O connect to columns 1 and 3 of the upper group of bit lines and columns 1 and 3 of the lower group of bit lines, respectively. They are activated by select lines SEL 1U, SEL 3U, SEL 1L and SEL 3L, respectively.

It will be appreciated that all four columns of bit lines receive power even though there are only two contact bit lines per group of four cell bit lines. It will further be appreciated that each cell bit line is accessed by only one select transistor.

FIG. 2 indicates that memory cells are located between neighboring cell bit lines, a row of which is accessed with a single word line WL. For clarity, only cells P, Q, R, and S are shown with their word line WLB. The memory cells can be any type of memory cell, such as ROM, EPROM, EEPROM and FLASH EEPROM cells, for example.

The present architecture is particularly suited to memory cells which prefer symmetric accessing. For example, the NROM cell, described in applicant's copending application Ser. No. 08/902,890 filed Jul. 30, 1997, entitled "Non-Volatile Electrically Erasable And Programmable Semiconductor Memory Cell Utilizing Asymmetrical Charge Trapping" and assigned to Saifun Semiconductors, the same assignee as this application, which is incorporated herein by reference, is read in one direction and programmed in the other direction. This cell requires a symmetric architecture such as is shown herein in FIG. 2. Furthermore, the dual bit NROM cell, described in applicant's copending application Ser. No. 08/905,286 filed Aug. 1, 1997, entitled "Two-Bit Non-Volatile Electrically Erasable And Programmable Semiconductor Memory Cell Utilizing Asymmetrical Charge Trapping" and assigned to Saifun Semiconductors, the same assignee as this application which is incorporated herein by reference and shown hereinbelow with respect to FIG. 3, requires a symmetric architecture to read both bits of the cell. The following discussion will assume a single bit cell unless specifically mentioned otherwise.

As will be described herein in more detail, each memory cell is accessed by one select transistor "above" it and one select transistor "below" it, thereby ensuring that the current path from the two active contacts is equal for every memory cell and thus, the resistance associated with the current path to each memory cell is generally equal.

The four exemplary cells in row B are labeled P, Q, R and S, where cell P is between cell bit lines $1B_i$ and $2B_i$, cell Q is between cell bit lines $2Bi$ and $3Bi$, cell R is between cell bit lines $3Bi$ and $4Bi$ and cell S is between cell bit lines $4Bi$ and $1B_{i+1}$. An exemplary current path through cell Q moves either from cell bit line $2Bi$ to cell bit line $3Bi$ or in the reverse direction. In either case, cell bit lines $2B_i$ and $3Bi$ must receive power from their respective metal lines $ME_i$ and $MO_i$. Even metal line $M_i$ provides a first voltage to even contact $E_i$' which is connected to even cell bit line $2B_i$, via select transistor 2L. Thus, select line SEL 2L must be activated. Odd metal line $MO_i$ provides power to odd contact $O_i$' which is connected to odd cell bit line $3B_i$ via select transistor 3U. Thus, select line SEL 3U must be activated.

It is noted that two select transistors are required to provide current to cell Q, one of which is an "upper" select transistor and one of which is a "lower" select transistor. This is true for every memory cell in the array. The two neighboring bit lines for a given cell are accessed from opposite directions and thus, the length of the current path through every cell is generally constant. The result is constant resistance for the current path associated with each memory cell.

Furthermore, since each cell bit line is accessed by only one select transistor, each memory cell is symmetrically accessed.

To access a single bit memory cell, the following must be activated: its word line WL, the two select lines associated with the select transistors which are connected to the cell bit lines of the memory cell, and the metal lines connected to the contacts associated with the activated select transistors. For example, cell Q is accessed by activating word line WLB, select lines SEL 2L and SEL 3U which activate select transistor 2L connected to contact $E_i$' and select transistor 3U connected to contact $O_i$', respectively, and metal lines $ME_i$ and $MO_i$ (which provide power to contacts $E_i$' and $O_i$', respectively).

The following table lists the cell bit lines which must receive power in order to access each cell P, Q, R and S of FIG. 2. It also lists the metal lines and select transistors needed to provide power to the listed cell bit lines. The select transistors are activated by activating the lines associated with them. Since the memory cells P, Q, R and S are on a single word line WLB, the word line is not listed though it must also be activated.

TABLE 1

| Cell | Drain Metal Line | Source Metal Line | Drain Select Transistor | Source Select Transistor |
|---|---|---|---|---|
| P | $MO_i$ | $ME_i$ | 1U | 2L |
| Q | $ME_i$ | $MO_i$ | 2L | 3U |
| R | $MO_i$ | $ME_i$ | 3U | 4L |
| S | $ME_1$ | $MO_{i+1}$ | 4L | 1U |

It is noted that cells P, Q, R and S define the four different types of cells. Each of these cells is accessed by the two metal lines providing power to their bit lines and by the two upper and two lower select lines which surround their bit lines.

For most memory cells, the metal line associated with the left cell bit line will receive the source voltage for reading, programming (if the cell is programmable) and erasure (if the cell is electrically erasable). For NROM cells which are programmed in the opposite direction from which they are read, the metal line associated with the left cell bit line will receive the source voltage during reading and the drain voltage during programming. The symmetry of the present architecture ensures that the NROM cells will be fully accessible during both reading (forward direction) and programming (backward direction).

Figure 3:
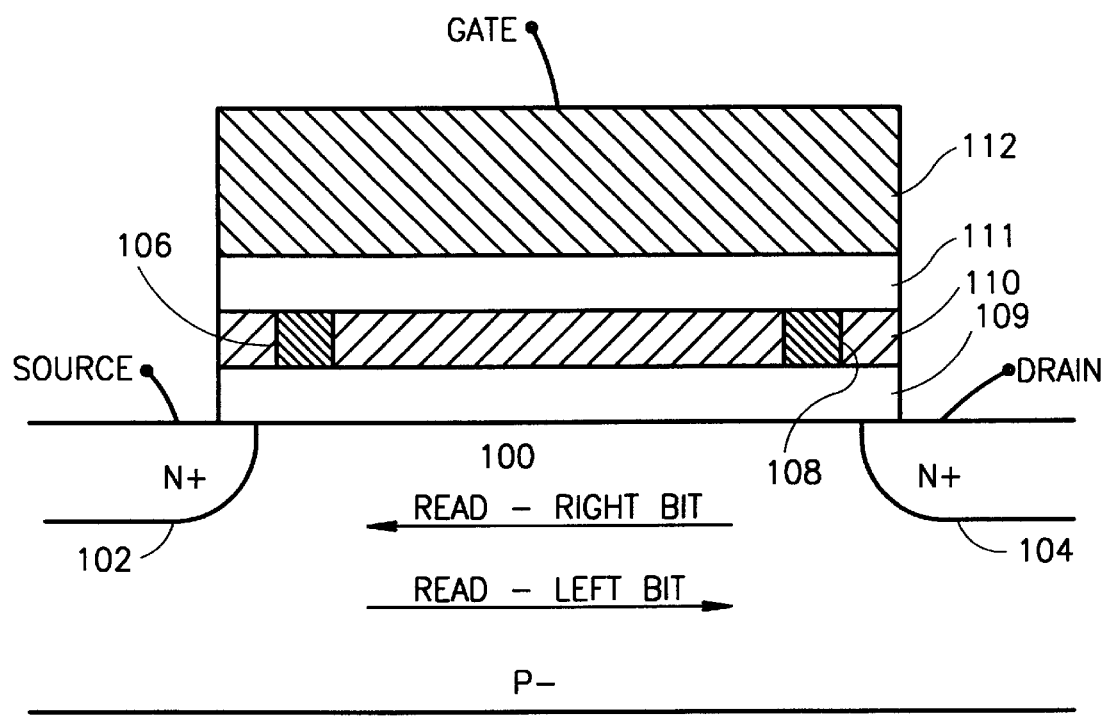
FIG. 3 is a schematic illustration of a dual bit cell of the type disclosed in copending application Ser. No. 08/905, 286, filed Aug. 1, 1997 entitled "Two Bit Non-Volatile Electrically Erasable and Programmable Semiconductor Memory Cell Utilizing Asymmetrical Charge Trapping" and assigned to Saifun Semiconductors, the same assignee as for this application.

The architecture of the present invention can also be utilized for dual bit cells of the type which have one bit on either side of the cell. Such a dual bit cell is described in applicant's copending U.S. patent application Ser. No. 08/905,286, filed Aug. 1, 1997 entitled "Two Bit Non-Volatile Electrically Erasable and Programmable Semiconductor Memory Cell Utilizing Asymmetrical Charge Trapping" and assigned to Saifun Semiconductors, the same assignee as for this application. FIG. 3, to which reference is now made, schematically illustrates the dual bit cell of U.S. patent application Ser. No. 08/905,286, filed Aug. 1, 1997. The cell has a single channel 100 between two bit lines 102 and 104 but has two separated and separately chargeable areas 106 and 108. Each area defines one bit. For the dual bit cell of FIG. 3, the separately chargeable areas 106 and 108 are found within a nitride layer 110 formed in an oxide-nitride-oxide sandwich (layers 109, 110 and 111) underneath a polysilicon layer 112.

To read the first bit, stored in area 106, bit line 104 is the drain and bit line 102 is the source. The cell is designed to ensure that, in this situation, only the charge in area 106 will affect the current in channel 100. To read the second bit, stored in area 108, the cell is read in the opposite direction. Thus, bit line 102 is the drain and bit line 104 is the source.

The truth table for reading the bits of cells P, Q, R and S, assuming the cells are dual bit cells, is presented hereinbelow in Table 2. Typical voltages might be: 2.7–3V on the word line WL (not listed in Table 2), 1.6–2V on the drain metal line, 0V on the source metal line and the standard chip voltage Vcc on the select lines. The subscript 1 refers to the left bit 106 and the subscript 2 refers to the right bit 108 in the cell of FIG. 3.

TABLE 2

| Cell | Drain Metal Line | Source Metal Line | Select Lines |
|---|---|---|---|
| P1 | $MO_i$ | $ME_i$ | 1U, 2L |
| P2 | $ME_i$ | $MO_i$ | 2L, 1U |
| Q1 | $ME_i$ | $MO_i$ | 2U, 3L |
| Q2 | $MO_i$ | $ME_i$ | 3L, 2U |
| R1 | $MO_i$ | $ME_1$ | 3U, 4L |
| R2 | $ME_i$ | $MO_i$ | 4L, 3U |
| S1 | $ME_i$ | $MO_{i+1}$ | 4L, 1U |
| S2 | $MO_{i+1}$ | $ME_i$ | 1U, 4L |

The dual bit NROM cell described in applicant's copending application Ser. No. 08/905,286, filed Aug. 1, 1997 stores two bits, as in FIG. 3. However, the dual bit NROM cells are programmed in the opposite direction from which it is read. Thus, if the first bit is read in one direction, it is programmed in the opposite direction.

The truth table for programming the bits of cells P, Q, R and S, assuming the cells are dual bit NROM cells, is presented hereinbelow in Table 3. Typical voltages might be:

6–10V on the word line WL (not listed in Table 3), 5.5–6.5V on the drain metal line, 0V on the source metal line and 10V on the select lines.

TABLE 3

| Cell | Source Metal Line | Drain Metal Line | Select Lines |
| --- | --- | --- | --- |
| P1 | $ME_i$ | $MO_i$ | 2L, 1U |
| P2 | $MO_i$ | $ME_i$ | 1U, 2L |
| Q1 | $MO_i$ | $ME_i$ | 3L, 2U |
| Q2 | $ME_i$ | $MO_i$ | 2U, 3L |
| R1 | $ME_1$ | $MO_i$ | 4L, 3U |
| R2 | $MO_i$ | $ME_i$ | 3U, 4L |
| S1 | $MO_{i+1}$ | $ME_i$ | 1U, 4L |
| S2 | $ME_i$ | $MO_{i+1}$ | 4L, 1U |

For erasing the data in NROM cells, the word lines of interest (one block or one or more blocks of word lines or the entire array of word lines) must be selected. In addition, for any set of word lines, all of the cell bit lines of the array must be selected while only the four select lines surrounding each block of word lines of interest must be selected. Typically, the word lines receive 0V or −5 to −8V, the bit lines receive 5.5 to 6.5V and the select lines receive 10V.

Figure 4A:
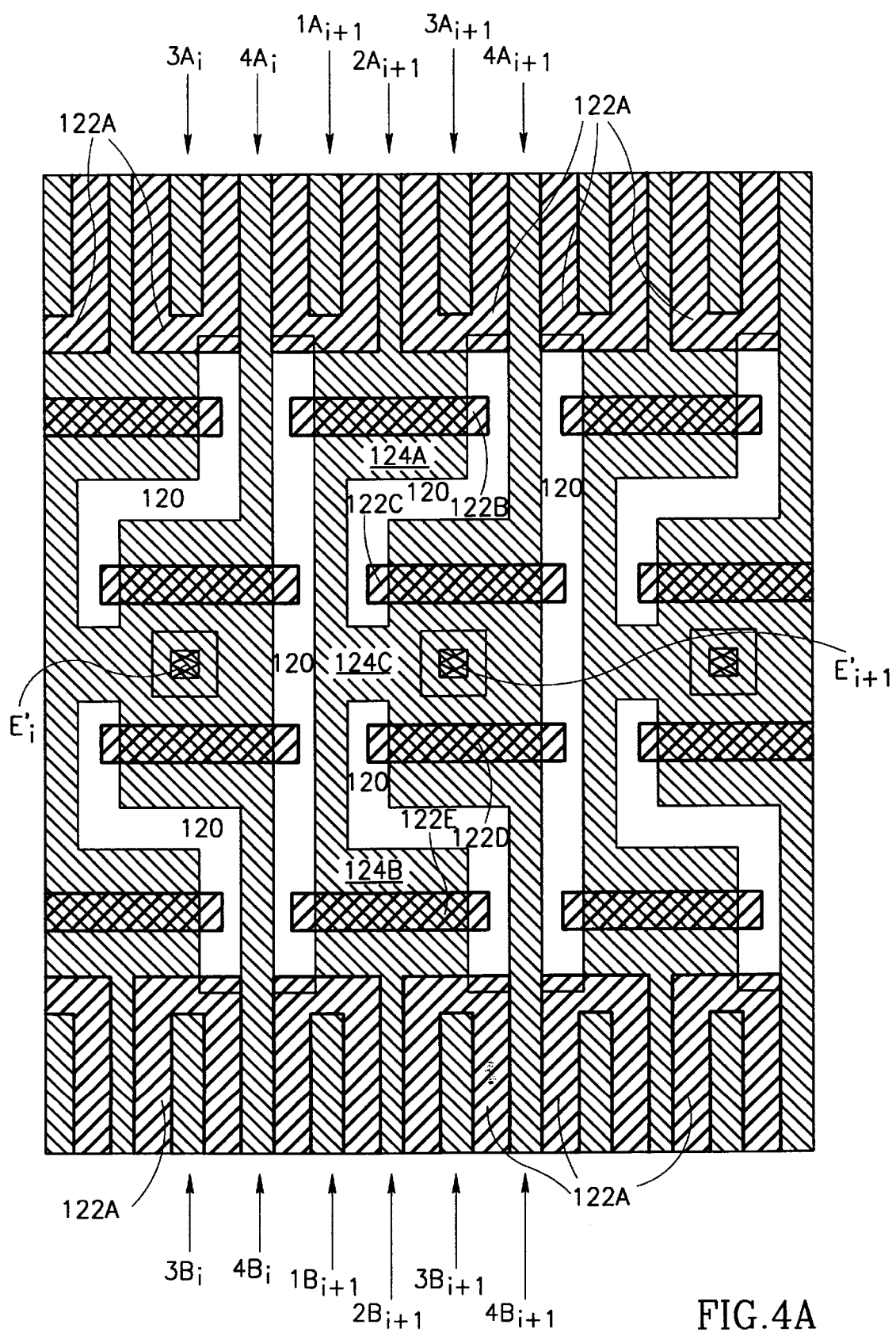
FIGS. 4A, 4B, 4C and 4D are illustrations of one exemplary layout of the architecture of FIG. 2.
Figure 4B:
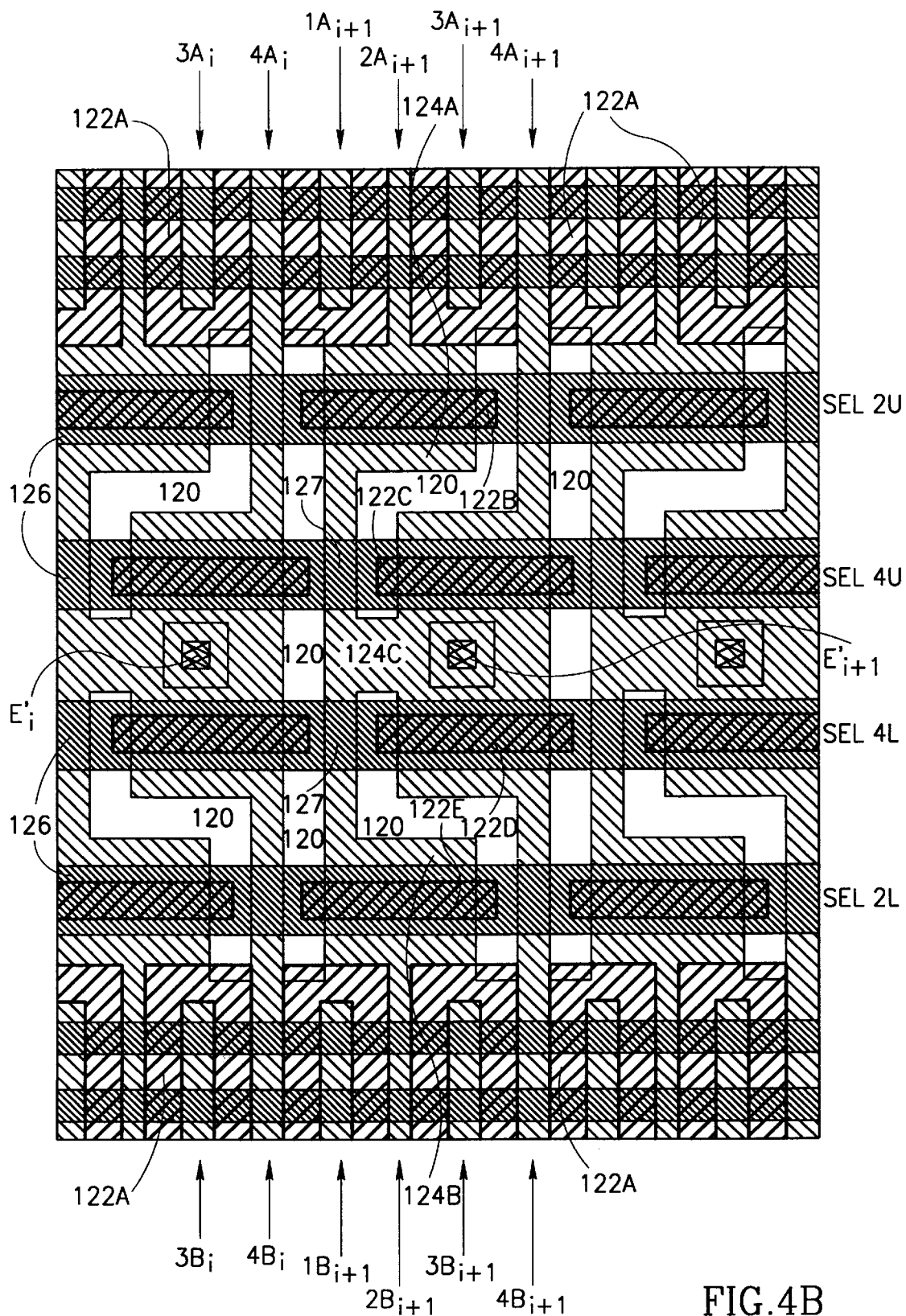
Figure 4C:
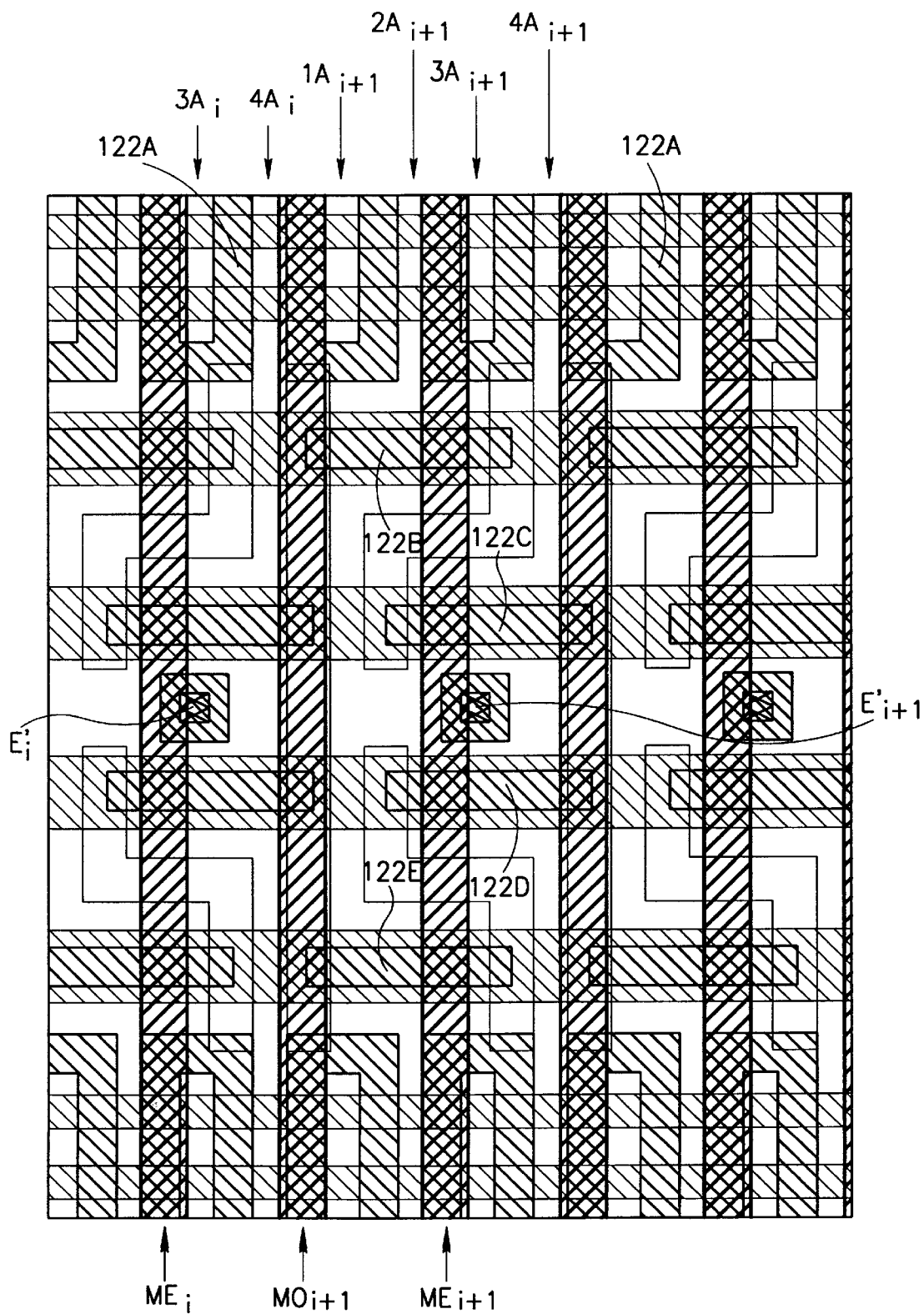
Figure 4D:
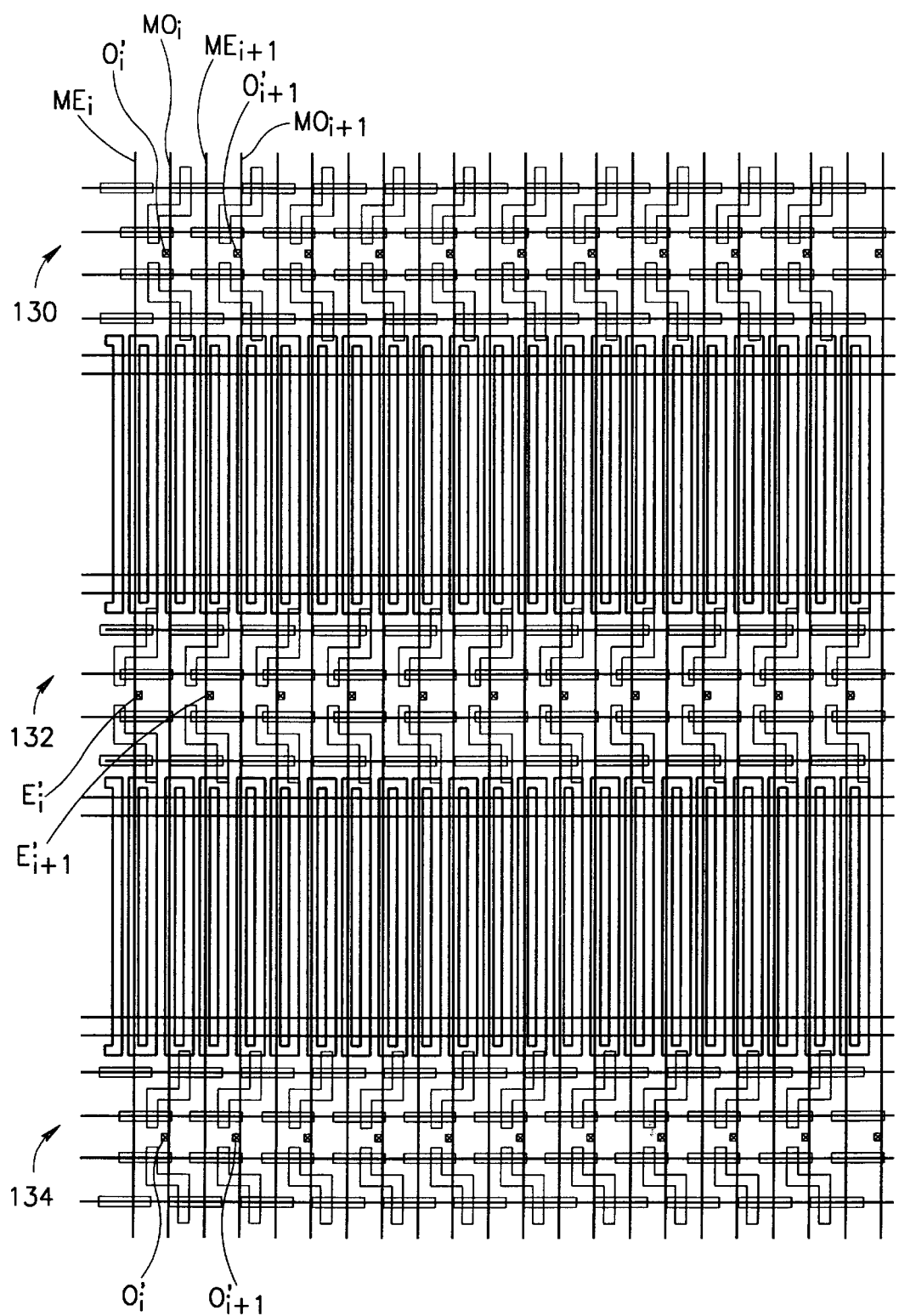

Reference is now made to FIGS. 4A, 4B, 4C and 4D which provide an exemplary layout for the architecture of FIG. 2. FIG. 4A shows, in expanded view, the isolation and bit line layers for the area around and including one section of select transistors, FIG. 4B shows the same area with the addition of the select lines, FIG. 4C shows the same area with the metal layer and FIG. 4D shows two blocks of the array and three select transistor sections, with the metal lines.

The manufacturing process which utilizes the layout shown herein can be any suitable manufacturing process. For example, it can be the process described in applicant's copending application Ser. No. 08/873,384 filed Jun. 11, 1997, entitled "An NROM Fabrication Method" and assigned to Saifun Semiconductors, the same assignee as this application, whose disclosure is incorporated herein by reference.

The isolation layer 120, shown in white, is typically a field oxide layer grown in the initial stages of manufacturing and provides isolation between neighboring select transistors.

After the isolation layer 120 is produced, a bit line mask 122 is laid down and a bit line implant is performed, producing bit lines wherever there is neither bit line mask 122 nor isolation 120. As can be seen, at the edge of the select area (and marking the edge of the cell area), the bit line mask 122 has a plurality of U shapes (these are marked with reference numerals 122A). The cell bit lines extend within and between the U shapes. FIG. 4A marks columns $3A_i$, $4A_1$ and $1A_{i+1}$ to $4A_{i+1}$ above the select area and columns $3B_i$, $4B_1$ and $1B_{i+1}$ to $4B_{i+1}$ below the select area. It is noted that the even columns extend into the select area (the odd columns extend into the neighboring select areas above and below the select area shown in FIG. 4A).

The bit line mask 122 also has horizontal select transistor markers, labeled 122B, 122C, 122D and 122E. These markers define the channels of the four select transistors. As can be seen, column $2A_{i+1}$ extends to transistor marker 122B, column $4A_{i+1}$ extends to transistor marker 122C, column $4B_{i+1}$ extends to transistor marker 122D, and column $2B_{i+1}$ extends to transistor marker 122E. These columns form the sources for the four select transistors 2U, 4U, 4L and 2L, respectively.

The remaining bit line area (labeled 124 and formed into an E shape) is the contact bit line and it forms the drains for the four select transistors, as follows: the upper bar of the E, labeled 124A, forms the drain of the 2U transistor (opposite column $2A_{i+1}$), the lower bar of the E, labeled 124B, forms the drain of the 2L transistor (opposite column $2B_{i+1}$), and the middle bar of the E, labeled 124C, forms the drains of the 4U and 4L transistors (opposite columns $4A_{i+1}$ and $4B_{i+1}$, respectively). As can be seen, the contact $E_{i+1}'$ is formed within middle bar 124C. FIG. 4A also shows contact $E_i'$.

As shown in FIG. 4B, the select lines are now formed, as a layer of polysilicon to be formed into rows over the channels 122B–122D of the select transistors. FIG. 4B shows the select lines themselves, labeled 126, rather than the mask which forms them. Each select line controls only one type of select transistor.

As can be seen, the vertical line of the contact bit line 124 forms a "feed-through", labeled 127 in FIG. 4B, below the select lines to connect the various drains. Furthermore, the contact bit line 124 and the select transistors reside within the pitch of four cell bit lines (columns 1, 2, 3 and 4 of group i+1). The contact $E_{i+1}'$ is aligned with column 3 although the feedthrough of contact bit line 124 is not. The elements labeled 127' are feedthroughs of the cell bit lines under the select lines.

FIG. 4C is similar to FIG. 4B but also shows the metal lines of which only metal lines $ME_i$, $MO_{i+1}$ and $ME_{i+1}$ are labeled. Only metal lines $ME_i$ and $ME_{i+1}$ are connected to their respective contacts $E_i'$ and $E_{i+1}'$. The other metal line $MO_{i+1}$ continues through to the neighboring select areas (as can be seen in FIG. 4D). FIG. 4D labels six contacts, $O_i'$ and $O_{i+1}'$ in the first select area 130, $E_i'$ and $E_{i+1}'$ in the second select area 132 and $O_i'$ and $O_{i+1}'$ in the third select area 134.

It is noted that select areas 130 and 134 are slightly different than select area 132 (which is shown in FIGS. 4A, 4B and 4C) since they connect to different contacts. However, the principles discussed herein are the same for all select areas.

Figure 5:
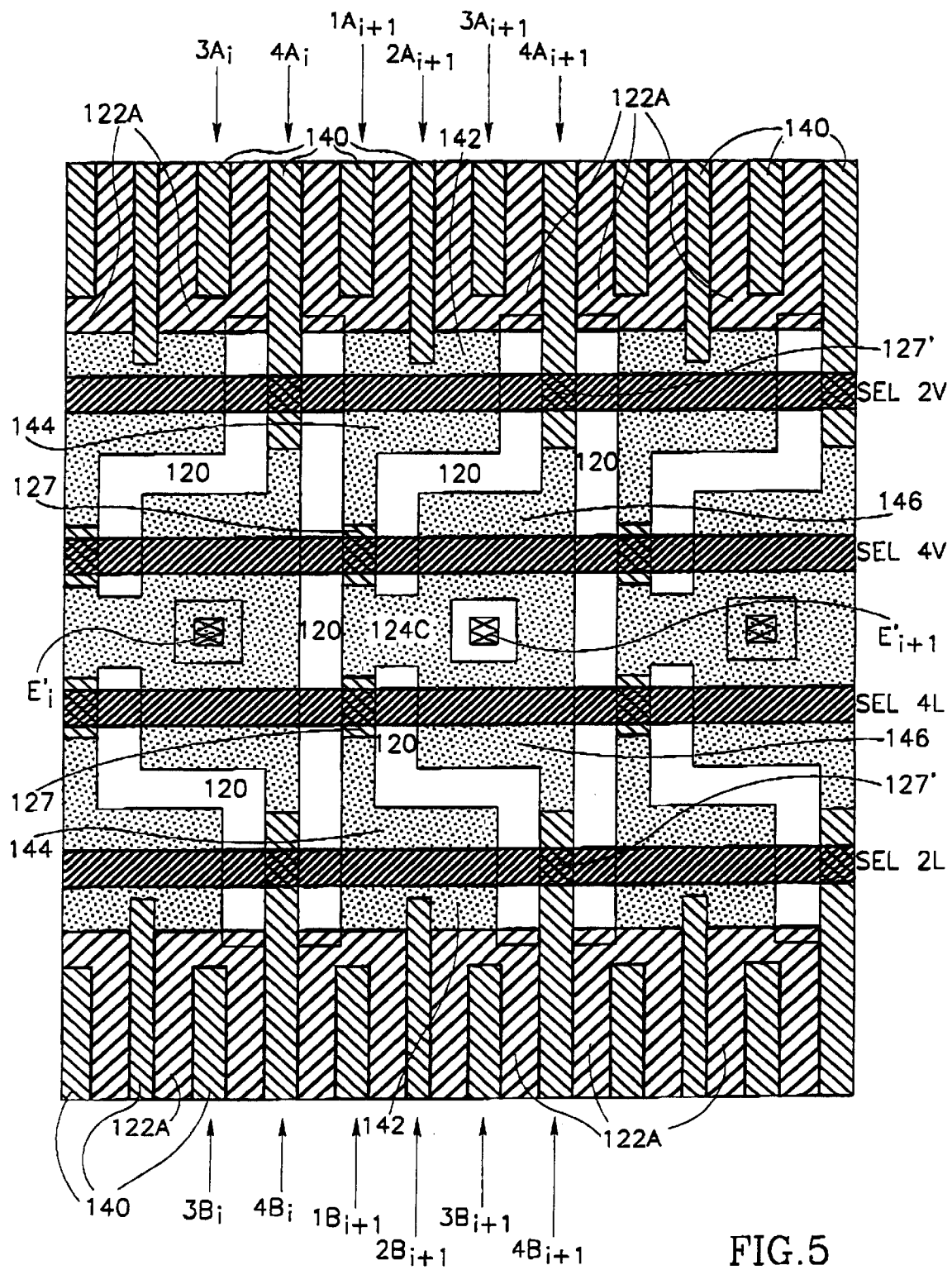
FIG. 5 is an illustration of an alternative layout of the architecture of FIG. 2.

FIG. 5, to which reference is now briefly made, has a similar layout to that of FIGS. 4A, 4B and 4C except that the bit lines are formed with two implants.

The first implant, marked in FIG. 5 with hatching, is provided in the cell areas to create straight portions 140 of the bit lines and, in the select areas, only in the areas of feedthroughs 127 and 127'. The remainder of the select areas are masked over. In FIG. 5, feedthroughs 127 connect the parts of contact bit line $E_i$ and feedthroughs 127' connect the parts of column 4 of each group. For odd contact bit lines $O_i$, the feedthroughs connect the parts of the odd contact bit lines and the parts of columns 3 (YES?) of each group.

The first mask is not shown in full in FIG. 5; instead, the U shapes 122A are shown but, for clarity only, the shape of the mask within the select areas is not shown.

After the bit lines and feedthroughs are implanted, the gate oxide for CMOS peripheral devices and for the select devices is grown using thermal oxidation. Following the oxidation, the select lines SEL are deposited in the select areas after which a second, n+implant is implanted in the select areas only. This second implant is noted in FIG. 5 with dots. It is noted that the second implant very slightly overlaps the cell area to ensure contact between the cell bit lines and the contact bit lines.

Because the second implant is performed after the select lines SEL are deposited, the second implant is self-aligned to the select lines. Furthermore, since the first implant was only in the areas of the feedthroughs 127 and 127', most of the areas under the select lines have no n+implant and thus, the select lines define the channels of the select transistors.

This is not true for the areas of the feedthroughs 127 and 127' which provide electrical feedthrough under the select lines SEL.

The combination of the first and second implants produces the cell and contact bit lines. For example, the straight portions 140 of columns $2A_{i+1}$ and $2B_{i+1}$, produced by the first implant, electrically connect with "T" portions, labeled 142, of the second implant which is on one side of select lines SEL 2U and 2L, respectively. On the other side of select lines SEL 2U and 2L are portions 144 which, via feedthroughs 127, are electrically connected to the central portion 124C of contact bit line $E_{i+1}$.

Similarly, the straight portion 140 of columns $4A_{i-1}$ and $4B_{i+1}$, produced by the first implant, extend electrically under the select lines SEL 2U and SEL 2L, respectively, due to feedthroughs 127', where they electrically connect with "L" portions 146 of the second implant. On the other side of select lines SEL 4U and 4L is the central portion 124C of contact bit line $E_{i+1}$.

As shown in FIG. 5, the contact bit line (marked with dots) has the same shape as before since it is located in the portion of the select areas not covered with field isolations 120. However, the channels of the select transistors are now defined by the width and location of the select lines SEL rather than by a bit line mask as in the previous embodiment. This enables the channels to be thinner than in the previous embodiment and it provides self-alignment to the select transistors.

Figure 6:
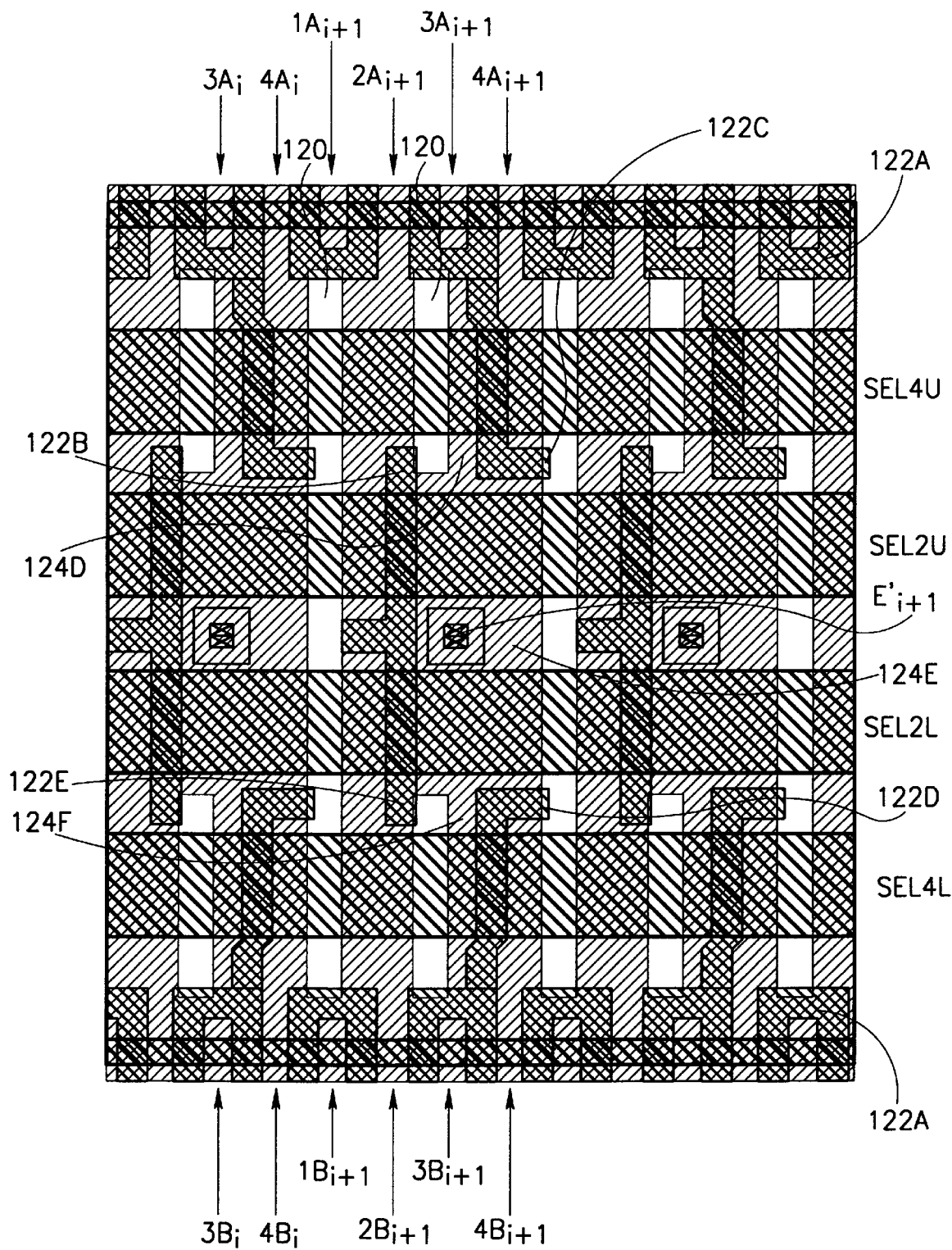
FIG. 6 is an illustration of a further alternative layout of the architecture of FIG. 2.

FIG. 6, to which reference is now briefly made, shows an alternative layout for the select areas. In this embodiment, the select transistor markers 122B–122E are vertical. The bit and select lines are changed accordingly. Sections 124D, 124E and 124F form one continuous contact bit line 124.

It will be appreciated that any layout which produces an architecture with the same connections as those of FIG. 2 is incorporated within the present invention and that the layouts of FIGS. 4, 5 and 6 are exemplary only.

It will be appreciated by persons skilled in the art that the present invention is not limited to what has been particularly shown and described hereinabove. Rather the scope of the present invention is defined only by the claims which follow.

I claim:

1. A symmetric memory array comprising:
a multiplicity of repeating segments, wherein said segments are formed into rows and columns and each segment includes:
a cell area formed of four segmented cell bit lines;
an even select area located at a first end of said cell area and including a segmented even contact bit line and two select transistors connecting said even contact bit line with the even cell bit lines of said segment; and
an odd select area located at an end opposite to said first end of said cell area and including a segmented odd contact bit line and two select transistors connecting said odd contact bit line with the odd cell bit lines of said segment;
one even contact connected to the even contact bit lines of two neighboring even select areas;
one odd contact connected to the odd contact bit lines of two neighboring odd select areas;
alternating even and odd metal lines connecting to said even and odd contacts, respectively.

2. A memory array according to claim 1 and also comprising memory cells formed between neighboring cell bit lines, wherein said memory cells are of a selected one of the following types of memory cells: read only memory (ROM), programmable read only memory (PROM), erasable programmable read only memory (EPROM), electrically erasable programmable read only memory (EEPROM), FLASH electrically erasable programmable read only memory (FLASH EEPROM), nitride ROM (NROM), dual bit ROM and dual bit NROM.

3. A memory array according to claim 1 wherein each combined select area formed of two select areas of the same type end the associated contact is laid out as follows:
said segmented contact bit line is formed within the pitch of said four cell bit lines;
said contact is connected towards the center of said segmented contact bit line;
first, second, third and fourth select lines, connecting to first and second select transistors of one of the select areas and third and fourth select transistors of the second one of said select areas, respectively, are formed within said select area wherein said select lines and contact are formed in the following order: first select line, second select line, contact, third select line and fourth select line; and
said segmented contact bit line includes feedthroughs under said second and third select lines thereby to reach said first and fourth select transistors, respectively.

4. A memory array according to claim 3 and wherein said contact bit line is formed as a self-aligned n+implant to each select line except at the locations of said feedthroughs.

5. A symmetric memory array comprising:
a plurality of segmented cell bit lines formed into at least two cell areas;
at least two select areas alternating with said cell areas, said select areas being formed of alternating even and odd select areas, wherein each select area per four cell bit lines comprises:
one segmented contact bit line per a group of four consecutive cell bit lines;
one contact per contact bit line; and
four select transistors per contact bit line, wherein said four select transistors of said even and odd select areas connect to the even and odd cell bit lines, respectively, of said groups of four cell bit lines above and below their select area; and
alternating oven and odd metal lines connecting to said contacts of said even and odd select areas, respectively.

6. A memory array according to claim 5 wherein said each said select area has repeating group layouts end each group layout is laid out as follows:
said segmented contact bit line is formed within the pitch of said four cell bit lines;
said contact is connected towards the center of said segmented contact bit line;
first, second, third and fourth select lines, connecting to first, second, third and fourth select transistors, respectively, of said four select transistors, are formed within said select area wherein said select lines and contact are formed in the following order: first select line, second select line, contact, third select line and fourth select line; and
said segmented contact bit line includes feedthroughs under said second and third select lines thereby to reach said first and fourth select transistors, respectively.

7. A memory array according to claim 5 and also comprising memory cells formed between neighboring cell bit lines, wherein said memory cells are of a selected one of the following types of memory cells: read only memory (ROM), programmable read only memory (PROM), erasable programmable read only memory (EPROM), electrically erasable programmable read only memory (EEPROM), FLASH erasable programmable read only memory (FLASH EPROM), nitride ROM (NROM), dual bit ROM and dual bit NROM.

8. A symmetric memory array comprising:

a multiplicity of memory cells;

a plurality of even and odd segmented cell bit lines, wherein each of said memory cells is formed between neighboring even and odd cell bit lines;

generally half as many metal lines as said cell bit lines, wherein each metal line provides power to either two consecutive even cell bit lines or two consecutive odd cell bit lines.

9. A memory array according to claim 8 and also comprising memory cells formed between neighboring cell bit lines, wherein said memory cells are of a selected one of the following types of memory cells: read only memory (ROM), programmable read only memory (PROM), erasable programmable read only memory (EPROM), electrically erasable programmable read only memory (EEPROM), FLASH electrically erasable programmable read only memory (FLASH EEPROM), nitride ROM (NROM), dual bit ROM and dual bit NROM.

10. A memory array according to claim 8 and also comprising means for connecting each said metal line to its associated even or odd bit lines.

11. A memory array according to claim 10 wherein said cell bit lines are formed into cell areas and wherein said means for connecting comprises:

at least two select areas alternating with said cell areas, said select areas being formed of alternating even and odd select areas, wherein each select area comprises: one segmented contact bit line per a group of four consecutive cell bit lines;

one contact per contact bit line; and four select transistors per contact bit line, wherein said four select transistors of said even and odd select areas connect to the even and odd cell bit lines, respectively, of said groups of four cell bit lines above and below their select area.

12. A symmetric memory array comprising:

a multiplicity of memory cells, wherein each cell comprises a virtual source region, a virtual drain region and a channel region formed therebetween;

at least one contact region isolated from said memory cells;

one select cell formed between each of said at least one contact region and the virtual source region of each of said multiplicity of memory cells and one select cell formed between said contact region and the virtual drain region of each of said multiplicity of memory cells.

13. A memory array according to claim 12 and also comprising memory cells formed between neighboring cell bit lines, wherein said memory cells are of a selected one of the following types of memory cells: read only memory (ROM), programmable read only memory (PROM), erasable programmable read only memory (EPROM), electrically erasable programmable read only memory (EEPROM), FLASH electrically erasable programmable read only memory (FLASH EEPROM), nitride ROM (NROM), dual bit ROM and dual bit NROM.

14. A symmetric memory array according to claim 12 and wherein each memory cell receives power to its virtual regions from contact regions located above and below said memory cell.

15. A symmetric memory array according to claim 12 and wherein each memory cell has generally the same resistance throughout the memory array.

\* \* \* \* \*